United States Patent
Heo et al.

(10) Patent No.: US 8,575,665 B2
(45) Date of Patent: Nov. 5, 2013

(54) GRAPHENE ELECTRONIC DEVICE AND METHOD OF FABRICATING THE SAME

(75) Inventors: Jin-seong Heo, Suwon-si (KR);
Hyun-jong Chung, Hwaseong-si (KR);
Sun-ae Seo, Hwaseong-si (KR);
Sung-hoon Lee, Hwaseong-si (KR);
Hee-jun Yang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/224,941

(22) Filed: Sep. 2, 2011

(65) Prior Publication Data
US 2012/0256167 A1    Oct. 11, 2012

(30) Foreign Application Priority Data
Apr. 7, 2011    (KR) .................. 10-2011-0032192

(51) Int. Cl.
*H01L 29/78*    (2006.01)
*H01L 21/78*    (2006.01)

(52) U.S. Cl.
USPC .............. 257/288; 257/24; 257/27; 257/29; 257/E21.409; 257/E21.411; 257/E29.273; 327/534; 438/151; 438/197; 438/758; 977/936

(58) Field of Classification Search
USPC ............. 257/220, 24, 27, 29, 288, E21.409, 257/E21.411, E29.273; 327/534; 438/151, 438/197, 758; 977/936
See application file for complete search history.

(56) References Cited

U.S. PATENT DOCUMENTS

| | | | |
|---|---|---|---|
| 2005/0212014 A1* | 9/2005 | Horibe et al. | 257/213 |
| 2007/0132043 A1* | 6/2007 | Bradley et al. | 257/414 |
| 2010/0127312 A1* | 5/2010 | Grebel et al. | 257/288 |
| 2010/0214012 A1 | 8/2010 | Raza | |

FOREIGN PATENT DOCUMENTS

| | | |
|---|---|---|
| JP | 2009-182173 A | 8/2009 |
| JP | 2009-277803 A | 11/2009 |
| WO | WO-2010065518 A1 | 6/2010 |

OTHER PUBLICATIONS

Alemán et al., "Transfer-Free Batch Fabrication of Large-Area Suspended Graphene Membranes", ACS Nano, Jul. 6, 2010, vol. 4, No. 8, p. 4762-4768.
Levendorf et al., "Transfer-Free Batch Fabrication of Single Layer Graphene Transistors", Nano Letters, Oct. 27, 2009, vol. 9, No. 12, p. 4479-4483.
Ariel Ismach, et al., "Direct Chemical Vapor Deposition of Graphene on Dielectric Surfaces," *Nano Lett.*, vol. 10, pp. 1542-1548 (2010), with additional Supporting Information.

* cited by examiner

*Primary Examiner* — Dao H Nguyen
(74) *Attorney, Agent, or Firm* — Harness, Dickey & Pierce, P.L.C.

(57) ABSTRACT

The graphene electronic device may include a gate oxide on a conductive substrate, the conductive substrate configured to function as a gate electrode, a pair of first metals on the gate oxide, the pair of the first metals separate from each other, a graphene channel layer extending between the first metals and on the first metals, and a source electrode and a drain electrode on both edges of the graphene channel layer.

9 Claims, 7 Drawing Sheets

GRAPHENE ELECTRONIC DEVICE AND METHOD OF FABRICATING THE SAME

CROSS-REFERENCE TO RELATED APPLICATIONS

This application claims the benefit of Korean Patent Application No. 10-2011-0032192, filed on Apr. 7, 2011, in the Korean Intellectual Property Office, the entire contents of which is incorporated herein by reference.

BACKGROUND

1. Field

Example embodiments relate to graphene electronic devices and methods of fabricating the same.

2. Description of the Related Art

Graphene having a 2-dimensional hexagonal carbon structure is a material that can replace semiconductors. Graphene is a zero gap semiconductor, and has a carrier mobility of 100,000 cm$^2$V$^{-1}$s$^{-1}$ which is about 100 times greater than that of conventional silicon at room temperature. Therefore, graphene may be applied to higher speed operating devices, for example, radio frequency (RF) devices.

When a graphene nano-ribbon (GNR) has a channel width of 10 nm or less, a band gap may be formed in the GNR due to the size effect. Accordingly, a field effect transistor that can be operated at room temperature may be fabricated using the GNR. A graphene electronic device refers to an electronic device, e.g., a field effect transistor, using a graphene. When a graphene electronic device is fabricated by transferring graphene on a substrate, the graphene may be damaged.

SUMMARY

Example embodiments provide methods of fabricating a graphene electronic device, in which graphene is prevented or impeded from contacting a photoresist by forming a metal protection layer therebetween before removing a metal catalyst layer under the graphene after directly growing the graphene on a substrate. Additional aspects will be set forth in part in the description which follows and, in part, will be apparent from the description, or may be learned by practice of example embodiments.

According to example embodiments, a graphene electronic device may include a gate oxide on a conductive substrate, the conductive substrate configured to function as a gate electrode, a pair of first metals on the gate oxide, the pair of the first metals separate from each other, a graphene channel layer extending between the pair of the first metals and on the pair of the first metals; and a source electrode and a drain electrode on both edges of the graphene channel layer.

The source electrode and the drain electrode may be formed of Au. The source electrode and the drain electrode may be formed to have a thickness in a range from about 10 nm to about 1,000 nm. The graphene channel layer may be a mono-layered graphene or a bi-layered graphene. The first metals may be bi-layered metal layers. The first metals may be Cu/Ni layers or Au/Ni layers.

According to example embodiments, a graphene electronic device may include a pair of first metals on a substrate, the pair of the first metals separate from each other, a graphene channel layer extending between the pair of the first metals and on the pair of the first metals, a source electrode and a drain electrode on both edges of the graphene channel layer, a gate oxide covering the graphene channel layer between the source electrode and the drain electrode, and a gate electrode on the graphene channel layer between the source electrode and the drain electrode.

According to example embodiments, a method of fabricating a graphene electronic device may include forming a gate oxide on a conductive substrate, the conductive substrate configured to function as a gate electrode, forming a first metal layer on the gate oxide, the first metal layer configured to function as a catalyst layer, forming a graphene layer on the first metal layer, forming a metal protection layer on the graphene layer; sequentially patterning the metal protection layer, the graphene layer, and the first metal layer using a first photoresist pattern, and exposing the graphene layer in a channel formation region by wet etching the metal protection layer and the first metal layer using a second photoresist pattern.

The graphene layer may be formed at a temperature in a range from about 550° C. to about 650° C. by inductively coupled plasma-chemical vapored deposition (ICP-CVD). Patterning the metal protection layer with the second photoresist pattern may include forming a source electrode and a drain electrode, and the graphene electronic device may be a field effect transistor.

According to example embodiments, a method of forming a graphene electronic device may include forming a first metal layer on a substrate, the first metal layer configured to function as a catalyst layer, forming a graphene layer on the first metal layer, forming a metal protection layer on the graphene layer, sequentially patterning the metal protection layer, the graphene layer, and the first metal layer using a first photoresist pattern, exposing the graphene layer in a channel formation region by wet etching the metal protection layer and the first metal layer using a second photoresist pattern, forming a gate oxide covering the exposed graphene layer, and forming a gate electrode on the gate oxide.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
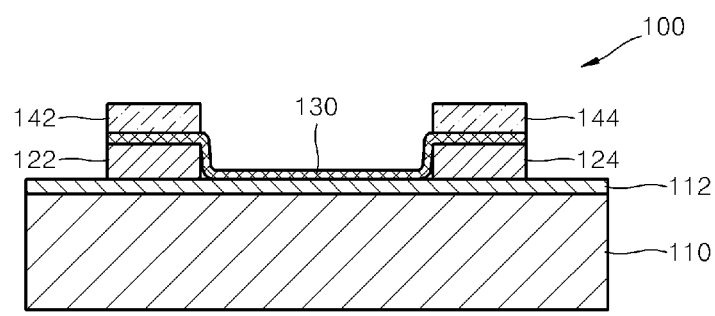
FIG. 1 is a schematic cross-sectional view of a structure of a graphene electronic device according to example embodiments.

Reference will now be made in detail to example embodiments, examples of which are illustrated in the accompanying drawings, wherein the thicknesses of layers and regions are exaggerated for clarity and like reference numerals are used to indicate substantially identical elements throughout and the descriptions thereof will not be repeated.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
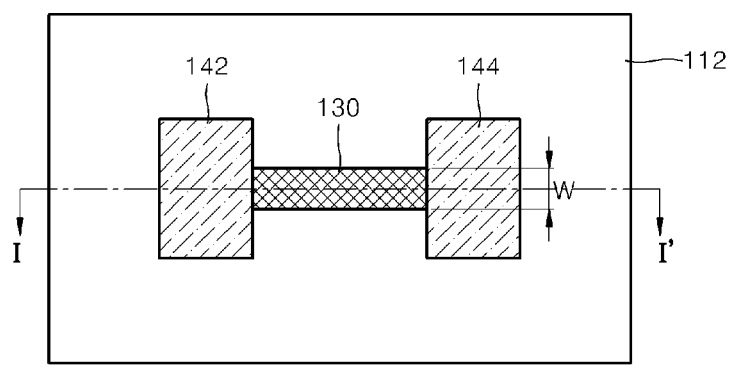
FIG. 2 is a plan view of the graphene electronic device of FIG. 1.

FIG. 1 is a schematic cross-sectional view of a structure of a graphene electronic device 100 according to example embodiments. FIG. 2 is a plan view of the graphene electronic device 100 of FIG. 1. FIG. 1 is a cross-sectional view taken along a line I-I' of FIG. 2.

Referring to FIGS. 1 and 2, a gate oxide 112 may be formed on a silicon substrate 110. The gate oxide 112 may be formed to have a thickness in a range from about 100 nm to about 300 nm using silicon oxide. The silicon substrate 110 may be a conductive substrate and may also be referred to as a gate electrode. Instead of the silicon substrate 110, another conductive substrate may be used.

A pair of first metals 122 and 124 separated by a predetermined or given distance from each other may be formed on the gate oxide 112. The first metals 122 and 124 may be metal layers formed by patterning a metal layer (not shown). The first metals 122 and 124 may be a bi-layered metal layer, and may be a copper (Cu)/nickel (Ni) layer or a gold (Au)/Ni layer. Cu or Au formed on the gate oxide 112 may have a thickness in a range from about 100 nm to about 500 nm. Ni formed on the Cu or Au may have a thickness in a range from about 10 nm to about 30 nm.

A graphene channel layer 130 may be formed on the first metals 122 and 124 to extend therebetween. The graphene channel layer 130 may contact the gate oxide 112 between the first metals 122 and 124. The graphene channel layer 130 may be formed by patterning a graphene layer formed by a chemical vapor deposition (CVD) method on the first metals 122 and 124. The first metals 122 and 124 perform as catalysts for growing graphene. The graphene may be a mono-layered graphene or a bi-layered graphene. Accordingly, the graphene channel layer 130 obtained by patterning graphene has a mono-layered structure or a bi-layered structure.

A source electrode 142 and a drain electrode 144 may be respectively formed on both edges of the graphene channel layer 130. The source electrode 142 and the drain electrode 144 may be respectively formed directly on or over the first metals 122 and 124 with substantially the same shapes as the first metals 122 and 124. The source electrode 142 and the drain electrode 144 may be formed to have a thickness in a range from about 10 nm to about 1000 nm using Au or a metal other than Au. Au may form a desirable contact with graphene and may be readily dry etched or wet etched.

When the graphene channel layer 130 having a width W in a range from about 1 nm to about 20 nm is formed, the graphene channel layer 130 may have a band gap due to a size effect the same as semiconductor characteristics. Accordingly, the graphene electronic device 100 of FIG. 1 may be a back gate field effect transistor. The graphene electronic device 100 may be able to be operated at room temperature.

In the graphene electronic device 100 according to example embodiments, the graphene channel layer 130 may be formed without a transferring process. Therefore, damage of the graphene channel layer 130 during a transferring process may be avoided.

Figure 3:
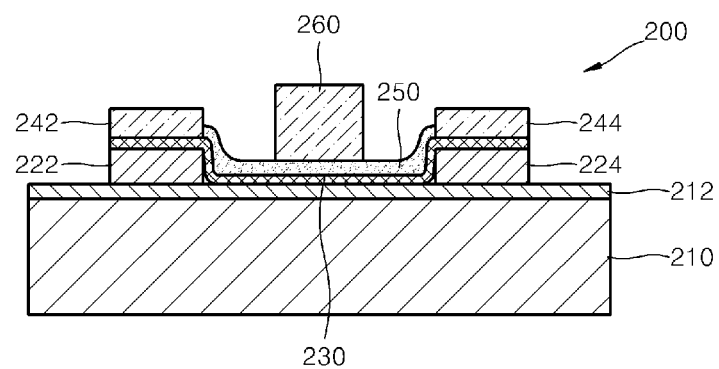
FIG. 3 is a schematic cross-sectional view of a structure of a graphene electronic device according to example embodiments.
Figure 4:
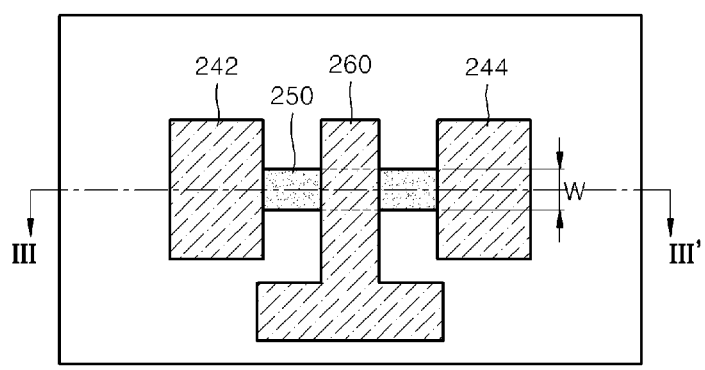
FIG. 4 is a plan view of the graphene electronic device of FIG. 3.

FIG. 3 is a schematic cross-sectional view of a structure of a graphene electronic device 200 according to example embodiments. FIG. 4 is a plan view of the graphene electronic device 200 of FIG. 3. FIG. 3 is a cross-sectional view taken along a line III-III' of FIG. 4.

Referring to FIGS. 3 and 4, an insulating layer 212 may be formed on a silicon substrate 210. The insulating layer 212 may be formed to have a thickness in a range from about 100 nm to about 300 nm using silicon oxide. When an insulating substrate is used instead of the silicon substrate 210, the insulating layer 212 may be omitted.

A pair of first metals 222 and 224 separated by a predetermined or given distance from each other may be formed on the insulating layer 212. The first metals 222 and 224 may be metal layers formed by patterning a metal layer (not shown). The first metals 222 and 224 may be a bi-layered metal layer, and may be a Cu/Ni layer or an Au/Ni layer. Cu or Au formed on the insulating layer may have a thickness in a range from about 100 nm to about 500 nm. Ni formed on the Cu or Au may have a thickness in a range from about 10 nm to about 30 nm.

A graphene channel layer 230 may be formed on the first metals 222 and 224 to extend therebetween. The graphene channel layer 230 may contact the gate oxide 212 between the first metals 222 and 224. The graphene channel layer 230 may be formed by patterning a graphene layer formed by a CVD method on the first metals 222 and 224 and the insulating layer 212 therebetween. The first metals 222 and 224 perform as catalysts for growing graphene. The graphene may be a mono-layered graphene or a bi-layered graphene. Accordingly, the graphene channel layer 230 obtained by patterning the graphene has a mono-layered structure or a bi-layered structure.

A source electrode 242 and a drain electrode 244 may be respectively formed on both edges of the graphene channel layer 230. The source electrode 242 and the drain electrode 244 may be respectively formed directly on or over the first metals 222 and 224 with substantially the same shapes as the first metals 222 and 224. The source electrode 242 and the drain electrode 244 may be formed to have a thickness in a range from about 10 nm to about 1000 nm using Au or a metal other than Au.

A gate oxide 250 may be formed on the graphene channel layer 230 using silicon oxide. A gate electrode 260 may be formed on the gate oxide 250 using a metal, for example, aluminum.

When the graphene channel layer 230 having a width W in a range from about 1 nm to about 20 nm is formed, the graphene channel layer 230 may have a band gap due to a size effect the same as semiconductor characteristics. Accordingly, the graphene electronic device 200 of FIG. 3 may be a top gate field effect transistor. The graphene electronic device 200 may be able to be operated at room temperature.

Figure 5A:
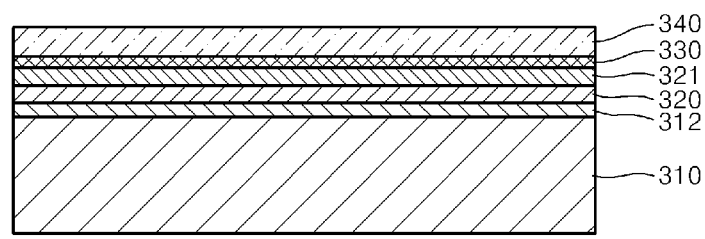
FIGS. 5A through 5D are cross-sectional views showing a method of fabricating a graphene electronic device according to example embodiments.

FIGS. 5A through 5D are cross-sectional views showing a method of fabricating a graphene electronic device according to example embodiments. Referring to FIG. 5A, a gate oxide 312 may be formed on a substrate 310. The substrate 310 may be a conductive silicon substrate doped with a dopant, and performs as a gate electrode. The gate oxide 312 may be a silicon oxide formed by thermally oxidizing the substrate 310, and may have a thickness in a range from about 100 nm to about 300 nm.

A first metal layer 320 may be formed on the gate oxide 312. The first metal layer 320 may be deposited using Cu or Au to a thickness in a range from about 100 nm to about 500 nm by a sputtering method. A second metal layer 321, for example, a Ni layer, may further be formed on the first metal layer 320 to a thickness in a range from about 10 nm to about 30 nm. The first metal layer 320 and the second metal layer 321 perform as catalysts for growing graphene.

A graphene layer 330 may be deposited on the second metal layer 321 at a temperature in a range from about 550° C. to about 650° C. by inductively coupled plasma-chemical vapored deposition (ICP-CVD). The graphene layer 330 may be formed in a mono-layered structure or a bi-layered structure. Because a CVD method that is performed at a temperature of about 1,000° C. is not used to form the graphene layer 330, damage to, for example, the substrate 310 by a high temperature may be avoided.

A metal protection layer 340 may be deposited on the graphene layer 330. The metal protection layer 340 may be formed to have a thickness in a range from about 10 nm to about 1,000 nm using Au.

Figure 5B:
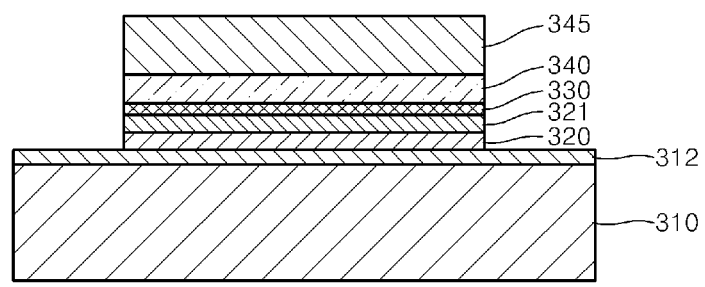

Referring to FIG. 5B, after forming a photoresist 345 on the metal protection layer 340, the metal protection layer 340, the graphene layer 330, the second metal layer 321, and the first metal layer 320 exposed by the photoresist 345 may be sequentially dry etched as in the stated order.

Figure 5C:
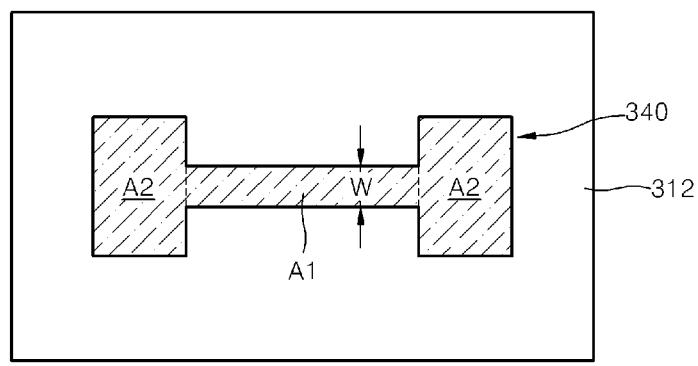

FIG. 5C is a plan view of the patterned result from which the photoresist 345 is removed. Referring to FIG. 5C, the shape of the patterned metal protection layer 340 includes a channel formation region A1 having a predetermined or given width W and electrode formation regions A2 on both edges of the channel formation region A1. The channel formation region A1 has the width W in a range of about 1 nm to about 20 nm.

Figure 5D:
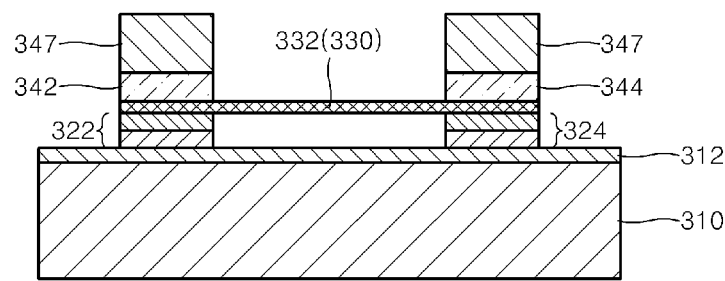

Referring to FIG. 5D, after forming a photoresist 347 on the electrode formation regions A2, metal layers in the channel formation region A1 that is exposed by the photoresist 347 may be selectively removed by wet etching. The metal layers may be the metal protection layer 340, the second metal layer 321, and the first metal layer 320. A wet etchant may be, for example, diluted hydrofluoric (DHF) acid. The graphene layer 330 may be exposed in the channel formation region A1. The exposed graphene layer 330 may be a channel layer 332. When the length of the channel layer 332 is extended to some degree, the channel layer 332 may contact the gate oxide 312 (refer to FIG. 1).

Both edges of the channel layer 332 extend to the electrode formation regions A2. In the electrode formation regions A2, a source electrode 342 and a drain electrode 344 may be formed on the channel layer 332 by patterning the metal protection layer 340. Also, in the electrode formation regions A2, first metal layers 322 and 324 may be formed under the graphene layer 330. The source electrode 342 and the drain electrode 344 may have substantially the same shapes as that of the first metal layers 322 and 324.

According to example embodiments, a graphene channel layer may be directly formed on a substrate without a transferring process. Accordingly, damage to the graphene channel layer in the transferring process may be avoided. Also, because graphene is grown at a relatively low temperature, damage to the substrate due to a high temperature may be avoided. Also, because a graphene channel layer is formed by wet etching graphene after forming a metal protection layer on the graphene, the contact of a photoresist with the graphene may be prevented or impeded by the metal protection layer, thereby preventing or impeding the loss of inherent characteristics of the graphene.

Figure 6A:
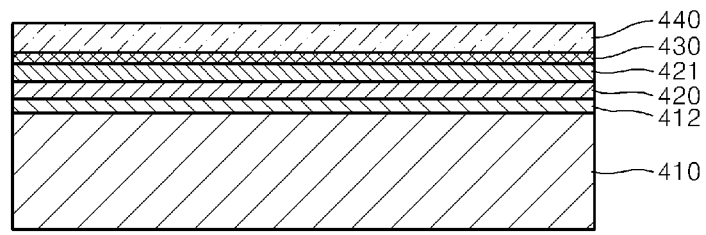
FIGS. 6A through 6E are cross-sectional views showing a method of fabricating a graphene electronic device according to example embodiments.

FIGS. 6A through 6E are cross-sectional views showing a method of fabricating a graphene electronic device according to example embodiments. Referring to FIG. 6A, an insulating layer 412 may be formed on a substrate 410. When the substrate 410 is formed of an insulating material, the insulating layer 412 may be omitted.

A first metal layer 420 may be formed on the insulating layer 412. The first metal layer 420 may be formed of Cu or Au to a thickness in a range of about 100 nm to about 500 nm by a sputtering method. A second metal layer 421, for example, an Ni layer, may further be formed on the first metal layer 420 to a thickness in a range of about 10 nm to about 30 nm. The first metal layer 420 and the second metal layer 421 may perform as catalyst layers for growing graphene.

A graphene layer 430 may be deposited on the second metal layer 421 at a temperature in a range of about 550° C. to about 650° C. by ICP-CVD. The graphene layer 430 may be formed in a mono-layered structure or a bi-layered structure. Because a CVD method that is performed at a temperature of about 1,000° C. is not used to form the graphene layer 430, damage to, for example, the substrate 410 by a high temperature may be avoided.

A metal protection layer 440 may be deposited on the graphene layer 430. The metal protection layer 440 may be formed to have a thickness in a range from about 10 nm to about 1,000 nm using Au.

Figure 6B:
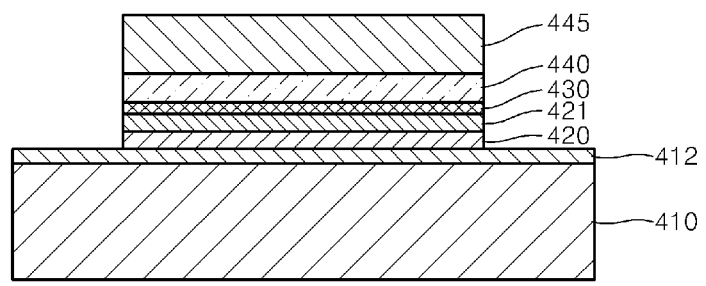

Referring to FIG. 6B, after forming a photoresist 445 on the metal protection layer 440, the metal protection layer 440, the graphene layer 430, the second metal layer 421, and the first metal layer 420 exposed by the photoresist 445 may be sequentially dry etched in the stated order.

Figure 6C:
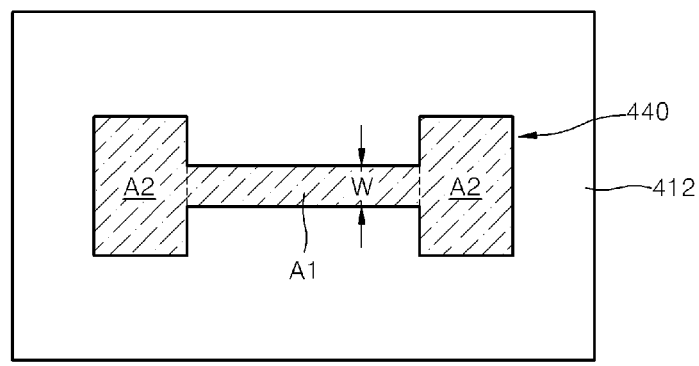

FIG. 6C is a plan view of the patterned result from which the photoresist 445 may be removed. Referring to FIG. 6C, the shape of the patterned metal protection layer 440 includes a channel formation region A1 having a predetermined or given width W and electrode formation regions A2 on both edges of the channel formation region A1. The channel formation region A1 has the width W in a range of about 1 nm to about 20 nm.

Figure 6D:
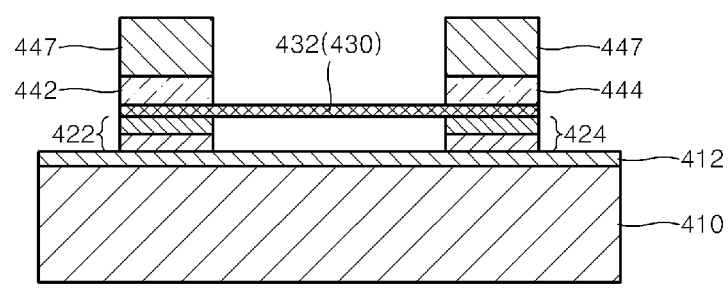

Referring to FIG. 6D, after forming a photoresist 447 on the electrode formation regions A2, metal layers in the channel formation region A1 that is exposed by the photoresist 447 may be selectively removed by wet etching. The metal layers may be the metal protection layer 440, the second metal layer 421, and the first metal layer 420. A wet etchant may be, for example, diluted hydrofluoric (DHF) acid. The graphene layer 430 may be exposed in the channel formation region A1. The exposed graphene layer 430 may be a channel layer 432.

Both edges of the channel layer 432 extend to the electrode formation regions A2. In the electrode formation regions A2, a source electrode 442 and a drain electrode 444 may be formed on the channel layer 432 by patterning the metal protection layer 440. Also, in the electrode formation regions A2, first metal layers 422 and 424 may be formed under the graphene layer 430. The source electrode 442 and the drain electrode 444 may have substantially the same shapes as that of the first metal layers 422 and 424.

Figure 6E:
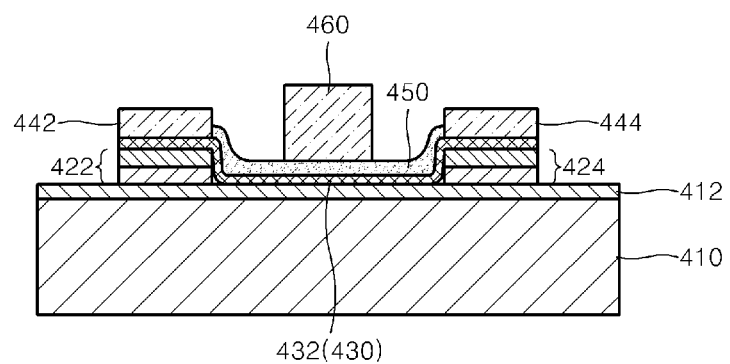

Referring to FIG. 6E, the photoresist 447 may be removed. When the length of the channel layer 432 is extended to some degree, the channel layer 432 may contact the gate oxide 412. A gate oxide 450 covering the channel layer 432 may be formed on the insulating layer 412. After forming a metal layer (not shown) on the gate oxide 450, a gate electrode 460 may be formed by patterning the metal layer.

In the method of fabricating a graphene electronic device according to example embodiments, because a metal protection layer is formed on a graphene layer when a metal catalyst layer formed under the graphene layer is wet etched, a direct contact between a photoresist pattern and the graphene layer may be prevented or impeded. Therefore, damage to graphene by the photoresist remaining when the photoresist pattern is removed may be prevented or impeded.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. A graphene electronic device comprising:
   a gate oxide on a conductive substrate, the conductive substrate configured to function as a gate electrode;
   a pair of first metals on the gate oxide, the pair of the first metals separate from each other;
   a graphene channel layer extending between the pair of the first metals and on the pair of the first metals; and
   a source electrode and a drain electrode on both edges of the graphene channel layer.

2. The graphene electronic device of claim 1, wherein the source electrode and the drain electrode are formed of Au.

3. The graphene electronic device of claim 1, wherein the source electrode and the drain electrode are formed to have a thickness in a range of about 10 nm to about 1,000 nm.

4. The graphene electronic device of claim 1, wherein the graphene channel layer is a mono-layered graphene or a bi-layered graphene.

5. The graphene electronic device of claim 1, wherein the first metals are bi-layered metal layers.

6. The graphene electronic device of claim 5, wherein the first metals are Cu/Ni layers or Au/Ni layers.

7. The graphene electronic device of claim 1, wherein the graphene channel layer covers an upper surface of the pair of first metals.

8. The graphene electronic device of claim 1, wherein the source electrode and the drain electrode are formed directly over the pair of first metals.

9. The graphene electronic device of claim 1, wherein the source electrode and the drain electrode have substantially the same shape as the pair of first metals.

* * * * *